United States Patent
Hussey

(10) Patent No.: US 10,048,348 B2
(45) Date of Patent: Aug. 14, 2018

(54) MEM RELAY ASSEMBLY FOR CALIBRATING AUTOMATED TEST EQUIPMENT

(71) Applicant: Teradyne, Inc., North Reading, MA (US)

(72) Inventor: Alan Hussey, Oak Park, CA (US)

(73) Assignee: Teradyne, Inc., North Reading, MA (US)

( * ) Notice: Subject to any disclaimer, the term of this patent is extended or adjusted under 35 U.S.C. 154(b) by 420 days.

(21) Appl. No.: 14/819,213

(22) Filed: Aug. 5, 2015

(65) Prior Publication Data

US 2017/0038453 A1     Feb. 9, 2017

(51) Int. Cl.
G01R 35/00     (2006.01)
G01R 31/28     (2006.01)
H01H 59/00     (2006.01)

(52) U.S. Cl.
CPC ....... *G01R 35/005* (2013.01); *G01R 31/2834* (2013.01); *H01H 59/0009* (2013.01)

(58) Field of Classification Search
USPC ......................................... 324/601, 637–650
See application file for complete search history.

(56) References Cited

U.S. PATENT DOCUMENTS

| | | | |
|---|---|---|---|
| 2003/0030453 A1 | 2/2003 | Mayder et al. | |
| 2005/0140546 A1* | 6/2005 | Park | G01S 7/4008 342/368 |
| 2006/0170435 A1 | 8/2006 | Graincher et al. | |
| 2008/0081958 A1* | 4/2008 | Denison | A61N 1/3706 600/300 |
| 2009/0184721 A1* | 7/2009 | Albert-Lebrun | G01R 27/32 324/601 |

(Continued)

FOREIGN PATENT DOCUMENTS

| | | |
|---|---|---|
| JP | 2006-319125 A | 11/2006 |
| WO | WO 2008-119179 A1 | 10/2008 |

OTHER PUBLICATIONS

Agilent Technologies, "Agilent Electronic vs. Mechanical Calibration Kits: Calibration Methods and Accuracy, White Paper," 5988-9477EN Jun. 2003, 16 pages.

(Continued)

*Primary Examiner* — Vincent Q Nguyen
(74) *Attorney, Agent, or Firm* — Wolf, Greenfield & Sacks, P.C.

(57) ABSTRACT

Apparatus and methods for calibrating tester channels of an automated test system. A relay matrix assembly including a plurality of microelectromechanical (MEM) switches may be used to connect a plurality of tester channels to an analyzer calibration instrument rapidly without requiring serial, robotic probing of the test channels. The relay matrix assembly may be constructed on a printed circuit board that can be attached to an interface on the tester. Calibration parameters for the test channels may be calculated from waveforms received through the relay matrix assembly and that have been corrected to remove waveform distortion introduced by the relay matrix assembly. Parameters to correct for distortion in the relay matrix assembly may be measured in advance and stored for use when calibration is to be performed.

15 Claims, 8 Drawing Sheets

(56) References Cited

U.S. PATENT DOCUMENTS

| | | | |
|---|---|---|---|
| 2009/0227214 A1* | 9/2009 | Georgantas | H04B 1/30 455/86 |
| 2009/0256656 A1* | 10/2009 | Huang | H01H 59/0009 335/2 |
| 2013/0082258 A1* | 4/2013 | Azzopardi | B81C 99/004 257/48 |
| 2015/0194956 A1 | 7/2015 | Zeng et al. | |

OTHER PUBLICATIONS

Agilent Technologies, "Agilent Specifying Calibration Standards for the Agilent 8510 Network Analyzer, Application Note 8510-5B," Jul. 2006, 32 pages.

Arnold, Richard M. et al, "An Explicit Solution for the Scattering Parameters of a Linear Two-Port Measured with an Imperfect Test Set," IEEE transactions on microwave theory and techniques, Jan. 1971, pp. 122-123.

Dhaene, T., et al., "Calibration and Normalization of Time Domain Network Analyzer Measurements," IEEE Transactions on Microwave Theory and Techniques, vol. 42, No. 4. Apr. 1994, pp. 580-589.

Gans, W. L. et al., "Continuous and Discrete Fourier Transforms of Steplike Waveforms," IEEE Trans. Inst. & Meas., vol. IM-31, No. 2, pp. 97-101, Jun. 1982.

Hiebel, M., "3.3 Calibration Standards," in *Fundamentals of Vector Network Analysis*, Jul. 2007, pp. 89-109, Rohde & Schwarz GmbH & Co., München, Germany.

Rytting, D., "Network Analyzer Error Models and Calibration Methods," slides 1-51, Agilent Technologies, Innovating the HP Way.

Shaarawi, A.M. et al., Spectrum Amplitude of Step-Like Waveforms Using the Complete-FFT Technique, IEEE Inst. & Meas. Technology Conf. vol. IM-34, No. 4, Dec. 1985, pp. 537-540.

Van Wijnen, P.J., "One-Port System Error Models and Calibration," Chapter 5 in *On the Characterization and Optimization of High-Speed Silicon Bipolar Transistors*, pp. 95-124.

Van Wijnen, P.J., "Two-Port System Error Models and Calibration," Chapter 6 in *On the Characterization and Optimization of High-Speed Silicon Bipolar Transistors*, pp. 125-165.

Williams, D., "De-embedding and Unterminating Microwave Fixtures with Nonlinear Least Squares," IEEE Transactions on Microwave Theory and Techniques, vol. 38, No. 6, Jun. 1990, pp. 787-791.

International Search Report and Written Opinion for International Application No. PCT/US2016/043066 dated Oct. 27, 2016.

\* cited by examiner the
MEM RELAY ASSEMBLY FOR CALIBRATING AUTOMATED TEST EQUIPMENT

BACKGROUND

Technical Field

The technology relates to methods and structures for calibrating test channels of automated test equipment (ATE).

Discussion of the Related Art

Referring to FIG. 1, a conventional ATE system 100 (sometimes referred to as a "tester" or an "ATE") may comprise an automated tester 110 having a plurality of test channels (not shown) that have contacts forming a tester interface 131. Each channel can each generate or measure a signal at a channel contact, which may be connected to a test point on a device under test 150 through a device interface board 135.

Within the tester 110, the test signals may be generated or measured in instruments. Each instrument may process signals for multiple channels, such that each instrument is coupled to multiple contacts at tester interface 131. Frequently, the contacts for each instrument are close together in tester interface 131. For example, a typical contact density would entail multiple regions, each about one square inch, having a large number of contacts, such as 64.

In some implementations, the device under test 150 may be a wafer or one or more packaged integrated circuits. For example, the ATE may be used for testing integrated circuit devices on a wafer for quality assurance prior to dicing the wafer and packaging the devices.

Because integrated circuit devices are typically manufactured in large quantities on a wafer and may be operated at high speeds (e.g., data rates up to and greater than 10 Gb/s), an automated tester 110 may have hundreds or thousands of channels. Each channel, itself, must operate at a high speed with high timing accuracy and high accuracy in measuring voltages or other parameters. To achieve the required accuracy, each channel is calibrated or verified from time to time.

In a conventional calibration procedure, calibration may be achieved by removing the device interface board 135 to expose the tester interface 131. The device interface board 135 may be replaced by a robot assembly with a single probe connected to a signal analyzer through a short coax cable. The robot may move the probe from one channel to another during the calibration process. Such connections made through a coaxial cable provide high signal fidelity at the instrument used for calibration measurements, ensuring that the measurements have the accuracy required for accurate calibration of tester channels.

SUMMARY

The inventor has recognized and appreciated that conventional calibration procedures for automated test equipment can require significant time because of robotic probing of test channels of the equipment. This significant time is due in part to serial, single-channel-at-a-time probing of the test channels. The time required for moving the robot for making single-channel-at-a-time measurements can constitute as much as 33% of the time required for a calibration process for a tester. The inventor has recognized and appreciated that, although this amount of time has been tolerable for conventional ATE calibration, that time will increase with future generations of ATE for which the number of test channels will be increased. The inventor has conceived of a MEM-based, relay matrix assembly that can eliminate the need for robotic probing of ATE test channels, and significantly increase the speed at which calibration and verification of an ATE can be done.

To provide the accuracy required for calibration, in accordance with some embodiments, characteristics of the MEMS-based, relay matrix assembly may be measured. Measurements made on signals coupled to an analyzer through the MEMS-based, relay matrix assembly may be mathematically altered based on the measured characteristics. These modified signals may then be used for tester calibration. In this way, accuracy of the calibration process may be maintained, while increasing the speed with which calibration is performed.

To provide the contact density required to make contact to channels at a tester interface, in accordance with some embodiments, the MEM-based, relay matrix assembly has localized regions of high contact density on a surface that, when installed, is adjacent the channel contacts on a test head. These high density contacts may align with channel contacts on the test head. The contact density may exceed the switch density within available MEM switch packages. High density may be achieved by aligning multiple MEM switch packages with each of multiple localized regions of high contact density. The MEM switch packages may have asymmetrically distributed contact pads such that only a portion of the MEM switch package is positioned above a localize region of high density contacts to make connections between those contacts and contact pads on the MEM switch package. In some implementations, the contact density may be greater than 64 contacts per square inch.

Apparatus and methods for calibrating channels of automated test equipment are described. According to some embodiments, a relay matrix assembly comprises a plurality of microelectromechanical (MEM) relay switches that are configured to connect to a plurality of tester channels, without requiring robotic motion and probing of the channels in a serial manner. Also described are methods for calculating parameters associated with waveform distortions introduced by paths through the relay matrix assembly, so that these distortions can be removed from measured waveforms. In some implementations, calibration parameters for a tester channel may be calculated from waveforms received through the relay matrix assembly after removing distortions introduced by a path through the relay matrix assembly.

According to some embodiments, a method for calibrating a plurality of tester channels may comprise connecting a relay matrix assembly to a tester. The relay matrix assembly may comprise a plurality of microelectromechanical (MEM) relays. The method may further include an act of actuating MEMS relays of the plurality of MEMS relays to successively connect tester channels of the plurality of tester channels to a first output connector of the relay matrix assembly. The MEM relays may comprise single pole, multi-throw MEM switches. The matrix assembly may be constructed from layers of such single pole, multi-throw MEM relays providing a large fan-in. For example, multiple layers in the matrix may switchably couple any one of 64 or more inputs to one output.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated, simplified, and/or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

The features and advantages of the embodiments will become more apparent from the detailed description set forth below when taken in conjunction with the drawings.

DETAILED DESCRIPTION

The inventor has recognized and appreciated that calibration and verification times for channels (also referred to as "tester channels") of an automated test equipment may be reduced by using a microelectromechanical (MEM) relay matrix assembly instead of a conventional robotic probe. Inputs to the relay matrix assembly can be connected to the tester channels. By switching the relays within the relay matrix assembly, signals from a selected tester channel may be quickly switched to an analyzing tool. Connections to numerous tester channels may be made without requiring robotic motion of the relay matrix assembly.

Heretofore, MEMs-based relay assemblies would not have been used for the large number of accurate measurements needed for calibrating tester channels because a relay matrix introduces signal distortion, precluding the accuracy required for tester calibration or verification. Further, conventional designs cannot achieve the density of relay contacts in a single package required to contact the tester channels on a tester interface with areas of localized high contact density. However, described herein is a board layout for a MEM-based relay matrix that achieves locally high contact density sufficient to make connections to channels in a tester interface. Techniques are also described to calibrate the MEM-based relay matrix so that distortion introduced in coupling signals to a calibration tool through the relay matrix assembly can be removed from the signals, allowing for accurate calibration.

Figure 1:
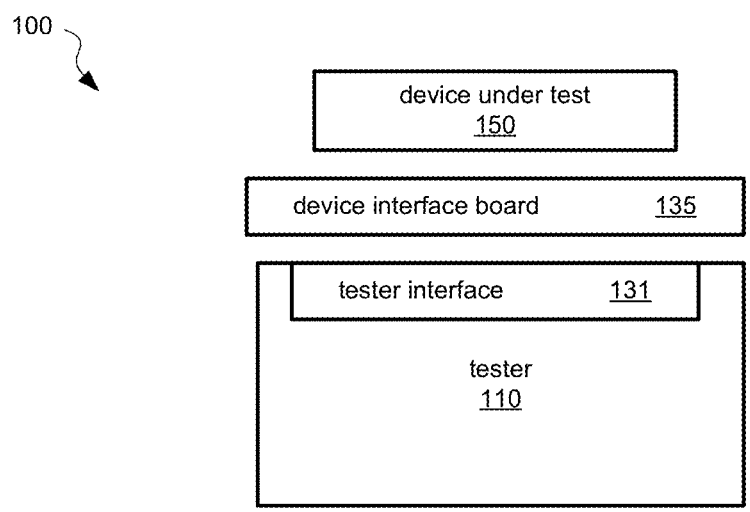
FIG. 1 is a block diagram depicting components associated with an automated test equipment, according to some embodiments.

In some embodiments, a relay matrix assembly may be mounted to a tester 110 (FIG. 1) so that inputs on the relay matrix assembly electrically connect to tester channels exposed at tester interface 131. In some embodiments, the relay matrix assembly may be mounted in place of the device interface board 135 (DIB) during a calibration procedure. The relay matrix assembly may connect directly to the tester interface 131 or may be coupled through one or more translators, interposers or other components. Such connections may be made using components as are known in the art for connecting a device interface board to a test system, or any other suitable components. In other embodiments, the relay matrix assembly may be mounted on top of the device interface board 135, making connection to the tester channels through the device interface board. Accordingly, it should be appreciated that the specific mechanism by which inputs of the relay matrix assembly are connected to tester channels is not a limitation on the invention.

The tester interface 131 may comprise a flat circuit board having a plurality of electrical test-channel contacts (e.g., pads or pins) distributed on the board. These contacts may provide connections to a plurality of test channels of the tester 110. There may be hundreds or even thousands of tester channel contacts on the tester interface 131, and the contacts may be arranged in regions having a locally high contact density. The contacts may be distributed on the tester interface in any suitable pattern. In some embodiments, the density of tester channel contacts in these regions of locally high contact density may be greater than 32 contacts per square inch. In some implementations, the contact density may be greater than 64 contacts per square inch. In some implementations, the contact density may be greater than 120 contacts per square inch, such as 128 contacts per square inch.

Figure 2A:
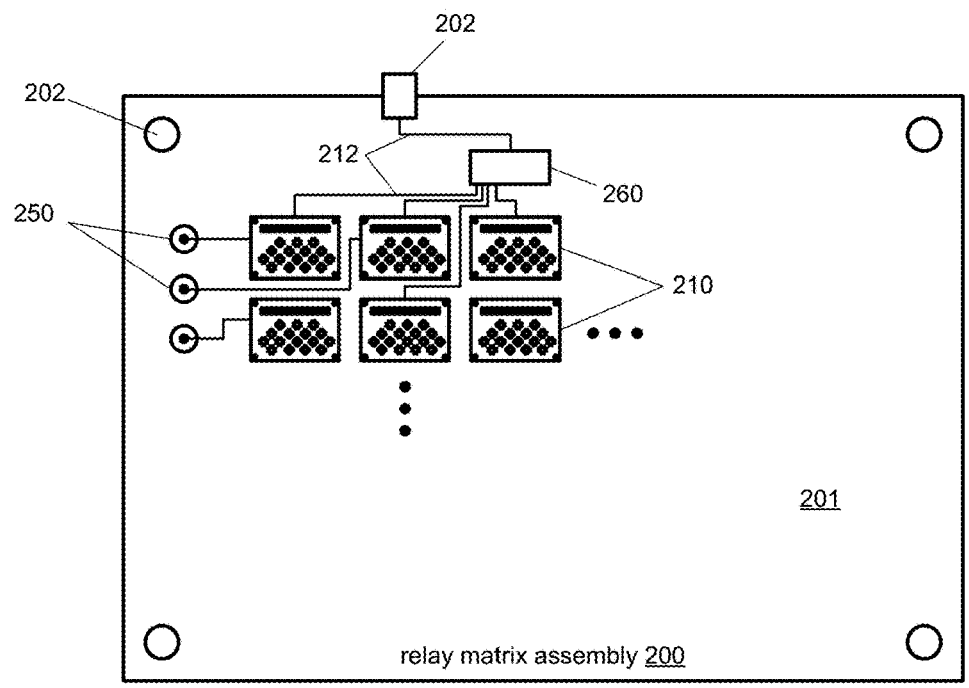
FIG. 2A depicts a relay matrix assembly, according to some embodiments.

FIG. 2A illustrates a relay matrix assembly 200 for calibrating tester channels. From time to time during the life of a tester, it is necessary to calibrate tester channels, so that they meet desired specifications, or verify that the tester meets those specifications. During a calibration procedure, a relay matrix assembly 200 depicted in FIG. 2A may be connected to a tester interface 131, and calibration procedures executed for each test channel of the ATE.

According to some embodiments, a relay matrix assembly 200 may comprise a printed circuit board 201. In some embodiments, the PCB 201 is configured to be fastened to a test head of a tester 110. For example, the printed circuit board may include holes 202, or some other fastening feature, to fasten the board 201 and assembly to the test head.

A relay matrix assembly 200 may further include a plurality of relay modules 210 arranged on the board 201. The relay modules 210 may each comprise a plurality of MEM-based relays 230. Each of the relays can be activated independently by control signals to connect any one of the multiple inputs of a relay module to any one of one or more outputs. In the embodiment illustrated, there may be one output such that each module implements a single pole, multi-throw switch. In accordance with some embodiments, there may be six inputs and one output, such that each of the MEM relays can switch any one of six inputs to the single output.

Figure 2B:
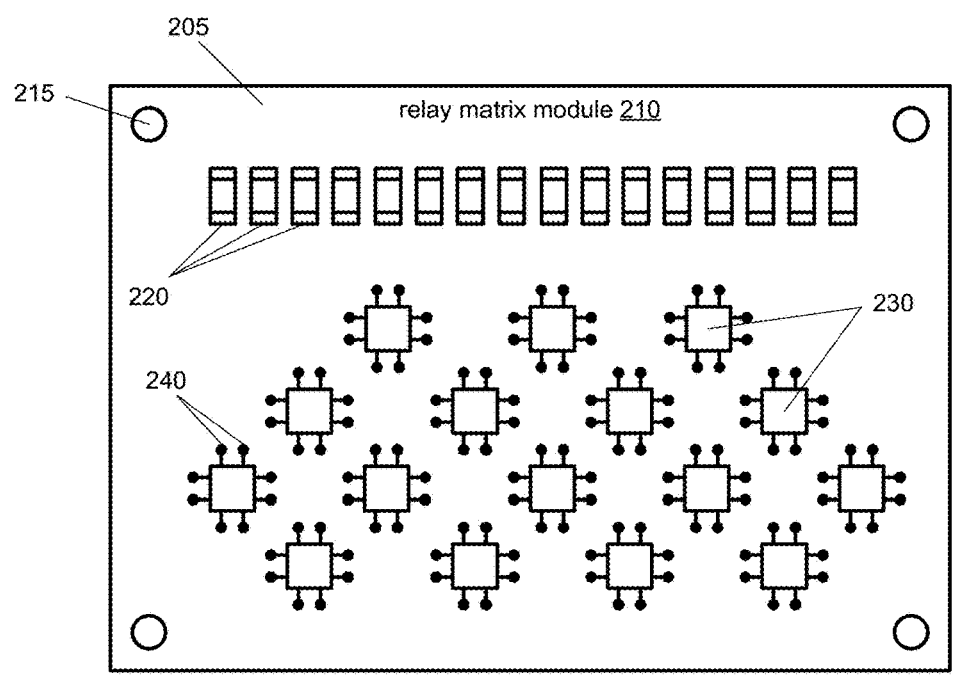
FIG. 2B depicts a relay matrix module, according to some embodiments.
Figure 3:
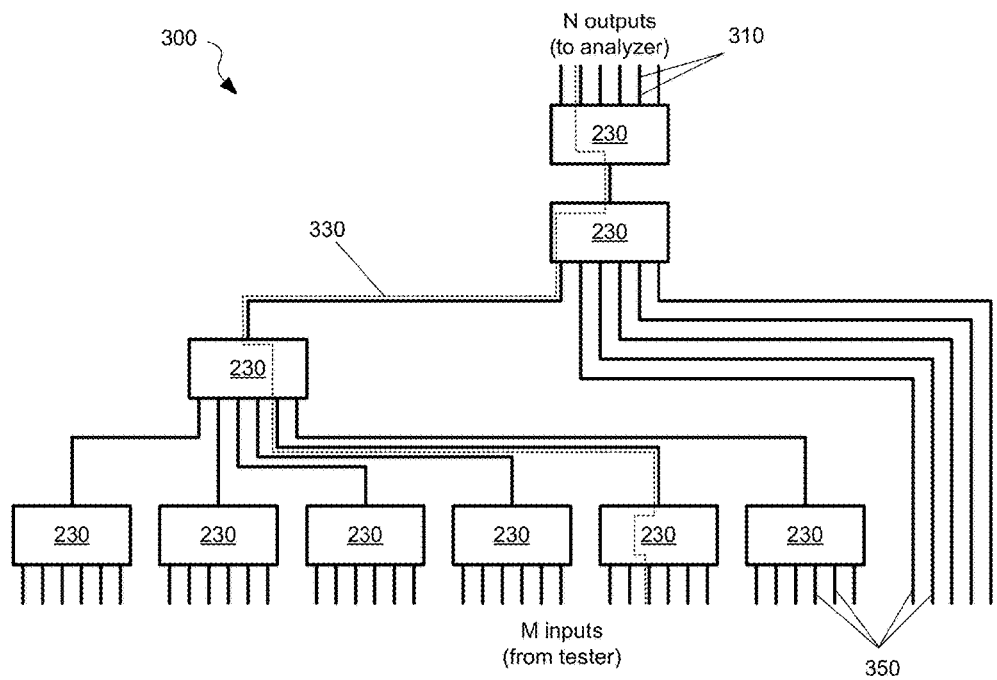
FIG. 3 illustrates through-channel connectivity of a relay matrix module, according to some embodiments.

As illustrated in more detail in FIG. 3, the relays 230 may connect in a hierarchy, such that the output of a relay at one level in the hierarchy may be connected to an input of a relay at a higher level of the hierarchy. The output of a relay at the highest level of the hierarchy may be connected to an output connector 250, as depicted in FIG. 2. An example of an output connector is an SMA connector. According to some embodiments, the relay matrix modules 210 may also be configured hierarchically, so that outputs of two or more relay matrix modules at one level in the hierarchy connect to an input of a relay matrix module at a higher or highest level of the hierarchy. The output or a relay module at the highest level of the hierarchy may connect to an output connector 250.

In some embodiments, there may be one or more output connectors 250. Such a configuration may enable the relay switches of the relay matrix to be activated to form multiple paths through the relay matrix. During calibration of a tester, one or more of these paths may be established at a time, enabling one or more signals to be coupled through the relay switch matrix to connect a tester to a calibration instrument. Multiple paths may enable multiple channels of the tester to be calibrated simultaneously or may enable stimulus signals from the calibration instrument to be applied to the tester and/or may enable multiple signals from the tester to be applied to the calibration instrument so that those signals can be compared. Accordingly, while one path through a relay matrix may be illustrated for simplicity, it should be appreciated that there may be more than one path.

Referring again to FIG. 2A, a relay module 210 may be electrically connected by control signal lines 212 to a communication port 202. According to some embodiments, a communication port may comprise a USB port, though other types of communication ports (wired or wireless) may be used. A relay module may receive switching control signals from an external source, such as a computer running a calibration routine, over the control signal lines 212. The switching control signals may activate MEM relays within one or more relay modules to select one path of a plurality of possible paths through the relay matrix.

In some implementations, a relay matrix assembly 200 may include on-board signal processing or switching logic 260 that aids in distribution of switching control signals to the relay matrix modules 210. In some embodiments, switching logic 260 may comprise a demultiplexor or a microcontroller. In some implementations, switching logic 260 may comprise an ASIC or FPGA. In some embodiments, there may be additional switching logic at each relay matrix module 210. In some implementations, switching logic 260 may comprise another relay matrix module 210.

On a reverse side of the relay matrix assembly may be a plurality of input contacts (e.g., pads or pins (not shown)). These input contacts may connect to the inputs of the relay modules 210 at the lowest level of the hierarchy. In some embodiments, there may be a number of input contacts arranged in a pattern that physically matches to a distribution of tester channel contacts at the tester interface 131. In such an embodiment, the relay matrix assembly 200 may be securely attached to a tester interface 110, and electrical connection may be made to each of the tester channel contacts on the tester head through the input contacts of the relay matrix assembly 200.

FIG. 2B depicts a relay matrix module 210 in greater detail, according to some embodiments. Each relay module 210 may comprise a plurality of MEM relays 230 and passive elements 220 arranged on a PCB 205. The circuit board 205 may include holes 215 or other fastening features (e.g., solder pads) for fastening the relay module 210 within the relay matrix assembly 200. In some embodiments, the circuit board 205 comprises a multi-level, high-speed PCB that can support data transmission rates greater than 10 Gb/s. An example of a high-speed PCB is a Megtron 6 PCB available from Panasonic PCB Materials of Santa Ana, Calif.

The MEM relays 230 may comprise microfabricated, electromechanical actuators that are configured to connect one or more input pins to one or more output pins within each MEM-based relay. For example, each relay may be configured to receive a switching control signal that determines which input pin of the relay will electrically connect to which output pin. According to some embodiments, input and output pins 240 of a MEM-based relay may be distributed around the relay 230, as depicted in the drawing of FIG. 2B.

There may be any suitable number of input and output pins on a MEM relay 230 that is used in a relay matrix assembly 200. In some implementations, there may be two or more input pins and two or more output pins at each MEM relay. According to some embodiments, a MEM relay 230 may comprise six input pins and one output pin. Additionally, there may be at least one control input pin for a MEMS relay that is electrically coupled to at least one control signal line 212 for receiving at least one switching control signal. In some implementations, each relay module 210 may be covered with a conductive shield to protect the MEM switches against electrostatic discharge which may potentially damage the MEM relays 230. A conductive shield may alternatively or additionally protect gold bond-wires used to connect the MEMS-relays to the PCB 200, which may be on the order of 0.001" in diameter.

The passive elements 220 on a relay module 210 may comprise resistors that are used to drain charge from the MEM relays, so as to improve their switching speeds. The resistors may also aid in discharging all lines to 0V as there are 90V signals which can create source leakage currents and develop significant voltages on floating relay interconnect lines that, when later closed, can damage the relays. According to some embodiments, the MEM relays 230 are incorporated in a circuit with a resistor 220 arranged to drain charge from a capacitive switching node of the relay (e.g., from the gate node). For example, a resistor having a value greater than 1 MΩ may be connected between a control gate of a MEM relay and ground. There may be additional resistors connected between ground and input, output, and internal nodes on a matrix module for draining accumulated charge and increasing switching speed of the relay. These resistors may have resistance values greater than about 10 kΩ. According to some embodiments, the arrangement of resistors and traces on a PCB provide a switching speed for a matrix module 210 of less than 0.1 ms.

One example of a MEM relay that may be used in a relay matrix assembly is the model RMSW260-SP6T MEMS switch available from RadantMEMS located in Stow, Mass. This device comprises a single-pole, six-throw relay capable of connecting a single pole (e.g., an output or input pin) to any one of six input or output pins. The device measures about 2 mm on a side, and is suitable for forming a high density of contacts connected to selectable paths. For example, the inventor has found that 15 of these MEM switches can be arranged on a PCB within a relay matrix module 210 to provide a contact density greater than 64 input contacts per square inch with each input contact corresponding to a different path through the matrix module. Other models of MEM switches may be used in some implementations, as well as devices manufactured by other vendors.

Because of their small size, a large number of MEM relays 230 may be included within a relay matrix module 210 measuring approximately one inch on each side. According to some embodiments, the number of input contacts on a reverse side of the matrix module 210 may be more than 32 contacts per square inch. In some cases, the density of contacts for a matrix module 210 may be greater than 64 contacts per square inch. Other contact densities may be achieved in other embodiments with different MEM based relays 230. The input contacts of a matrix module may be connected to a mother board of the relay matrix assembly 200 using any suitable means, e.g., ball-grid solder arrays.

However, as described above, the channel contacts at tester interface 131 may be arranged in groups with an approximate density 100-150 contacts per square inch in localized regions. The above-described relay matrix modules may have less than the required number of input connections in the same area. Accordingly, a relay matrix module 210 may be positioned so that two relay matrix modules 210 overlap each of the areas of high contact density of tester interface. In this way, in these localized regions of high contact density, the number of inputs to the relay matrix assembly can have at least the required density.

To support such a connection, the relay matrix modules 210 may have contacts that are not uniformly distributed across the module. Rather, in some embodiments the contacts on relay modules 210 may be skewed to occupy one half of the module. Accordingly, the half of the module may be aligned with the region of high density contacts on the tester interface 131. However, it should be appreciated that any suitable interconnection arrangement may be used to connect multiple the inputs of multiple relay modules to the contacts in a region of high contact density on tester interface 131.

FIG. 3 provides just one example of how MEMS relays 230 may be arranged within a relay matrix module 210 to enable selectable connectivity between M inputs (e.g., inputs that connect to tester channels directly) and N outputs (e.g., output channels that may connect to an instrument that receives and analyzes signals from the test channels). As just one example, the relays 230 may each comprise single-pole, six-throw (1×6) relays arranged to have six input channels that can be connected to tester channel pads of a tester and one output channel. The relays 230 may be arranged in parallel, according to some embodiments, as well as in serial, to provide connections between M inputs and N outputs of the relay matrix module 210, as depicted in the drawing.

By issuing switching control signals to relays 230 within a matrix module 210, a desired tester channel may be connected to a desired output channel of the matrix module. For example, there may be four of the relays 230 depicted in FIG. 3 that have been activated to select a first path 330 through the module (indicated by the dotted line). Each path may be selected without any lateral positioning or motion of the relay matrix assembly 200. Accordingly, robotic positioning of a probe is not needed to test all of the tester channels.

In some embodiments, relays may be connected so that a single path through the relay matrix is selected at one time. However, it is not a requirement that the relays be arranged so that there is only one active path. According to some embodiments, there may be a number of selected paths for a relay matrix assembly 200 to enable simultaneous analysis of tester channels.

Figure 4:
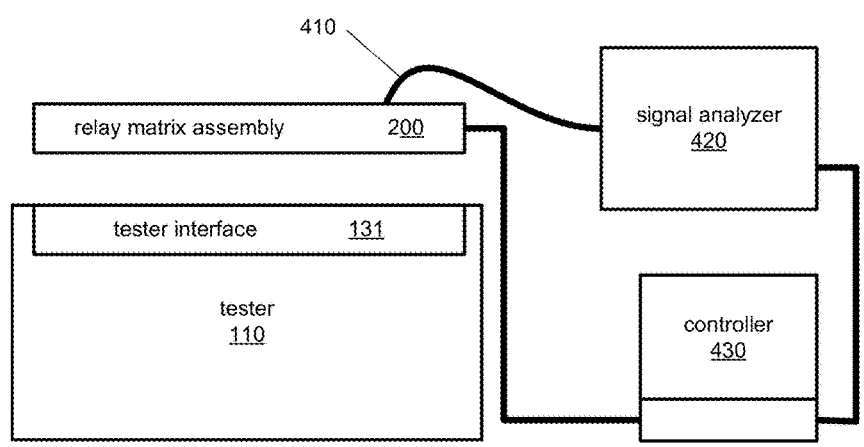
FIG. 4 depicts a set-up for calibrating test channels of an ATE, according to some embodiments.

FIG. 4 depicts apparatus for using a relay matrix assembly 200 to calibrate a tester, according to some embodiments. In some embodiments, the relay matrix assembly 200 may be fastened securely to a tester interface 131, so that M input contacts of the relay matrix assembly electrically connect to M test-channel contacts at tester interface 131. As noted above, such a connection may be made directly or through other components, such as an interposer or translator.

Controller 430 may be in communication with the relay matrix assembly 200 (e.g., via a USB or other communication link) and with a calibration instrument, such as a signal analyzer 420. In some implementations, the controller 430 may comprise a computer or at least one processor specially adapted with machine-readable instructions to issue switching control signals to the relay matrix assembly 200 in accordance with methods described herein. In some embodiments, the controller 430 receives data from the signal analyzer 420 for processing, and may compute calibration values for tester channels based on the received data. In some embodiments, the controller may also communicate with the tester 110, providing the calibration values to the tester to be stored and applied to adjust operation of instruments within the tester to operate in a calibrated way.

The signal analyzer 420 may be configured to receive one or more signals over communication links or cabling 410 from the relay matrix assembly 200. In some implementations, the signal analyzer may comprise an oscilloscope or a vector network analyzer (VNA). In some embodiments, the signal analyzer comprises a time-domain reflectometry (TDR) scope. However, it should be appreciated that any suitable signal analyzer may be used. In embodiments in which the relay matrix assembly comprises multiple outputs, there may be multiple such signal analyzers, each connected to a different output of the relay matrix assembly.

The inventor has found that a conventional VNA or oscilloscope may be capable of recording a signal associated with a test channel at approximately 5000 data samples at a 10 ps equivalent time-domain sample spacing, whereas an oscilloscope can sample waveforms at more than 20,000 samples, in some embodiments at a 50 ps sample spacing, or less. As another example, some commercially available oscilloscopes may sample at 5 ps or 4.2 ps. Regardless of the specific sample spacing, the oscilloscope may act as a signal analyzer, and the signals received by the signal analyzer may be received in parallel, according to some embodiments. It should be appreciated that 20,000 samples is an example and, in some embodiments, far more than 20,000 samples may be collected.

The controller 430 may issue switching control signals to activate individual MEM relays 230 on the relay matrix assembly, so as to select paths between tester channels and an output connector 250 that is connected to the signal analyzer 420. When a connection has been made between a selected tester channel and the signal analyzer 420, a test signal may be applied to and/or read from the tester channel for calibrating the test channel. According to some embodiments, the test signal is received by the signal analyzer, and may be processed at least in part at the signal analyzer. In some implementations, the received signal may be processed by the controller to evaluate waveform distortion for the selected tester channel. Such processing may be performed using known techniques or in any other suitable way. The process may be repeated for each test channel of the ATE.

Calibration parameters for each tester channel may be calculated to compensate for the waveform distortion introduced by each tester channel, and the calibration parameters may be stored by the controller. These tester channel calibration parameters may be used subsequently to compensate for waveform distortion introduced by each tester channel. The calibration parameters may be programmed into the tester or stored in memory at the ATE, in some embodiments. For example, software algorithms placed in operation on the tester may use the calibration parameters to compensate for waveform distortion introduced by each tester channel. Alternatively or additionally, the calibration parameters may be used to adjust hardware filters and/or alter a driver signal on the tester to reduce waveform distortion. The calibration parameters may adjust tester signal levels, signal delay and/or waveform shape within the tester so that signals arrive at the tester interface 131 meet instrument specifications (e.g., meeting specified rise and fall times, delay values, and signal levels).

Calibration of tester channels may be performed using techniques as are known in the art, which may be the same or similar to techniques used when a robotic probe is connected to each tester channel sequentially. However, in contrast to measurements made with conventional calibration equipment including a probe to connect a signal analyzer sequentially to tester channels through a high fidelity cable, a MEM relay matrix introduces more distortion. Accordingly, in some embodiments, the controller 430 may be programmed to apply, before using measurements for calibrating the tester, corrections for signal distortion introduced in the MEM relay matrix. This distortion may be different for each path through the MEM relay matrix, and controller 430 may store correction values for each possible path such that an appropriate value is applied regardless of which path or paths are selected.

Accordingly, a degree of distortion may be determined for each possible path through the MEM relay matrix. A representation of that distortion usable to correct for that distortion may be stored, such as by controller 430. However, it should be appreciated that correction information may be stored in any suitable location, including in memory on the relay assembly, "in the cloud" or in any computing device accessible over a computer network to a computing device that will process measurements made through the relay matrix assembly.

Regardless of where the correction information is stored, as a path is used for calibrating a tester channel, any measurements made on a signal passing over that path may be adjusted based on the stored correction information. The correction information may be stored in any suitable format, such as a transfer function. In this embodiment, adjusting for the distortion may entail applying the inverse of the determined transfer function. Alternatively, the characterization of the distortion may be stored as a time domain signal representative of the impulse response of the path, and the adjustment may be made by deconvolution of the measured signal with the stored time domain signal. In yet a further embodiment, the correction information may be stored as s-parameters. The s-parameters may be stored as multiple (4) sets (s11, s21, s12, s22) of frequency domain values. In some embodiments, four values per set may be stored for each channel. However, in some embodiments, only a single s-parameter (S21) may be used. However, more combinations even covering coupling can be added as additional s-parameter sets per channel.

Figure 5A:
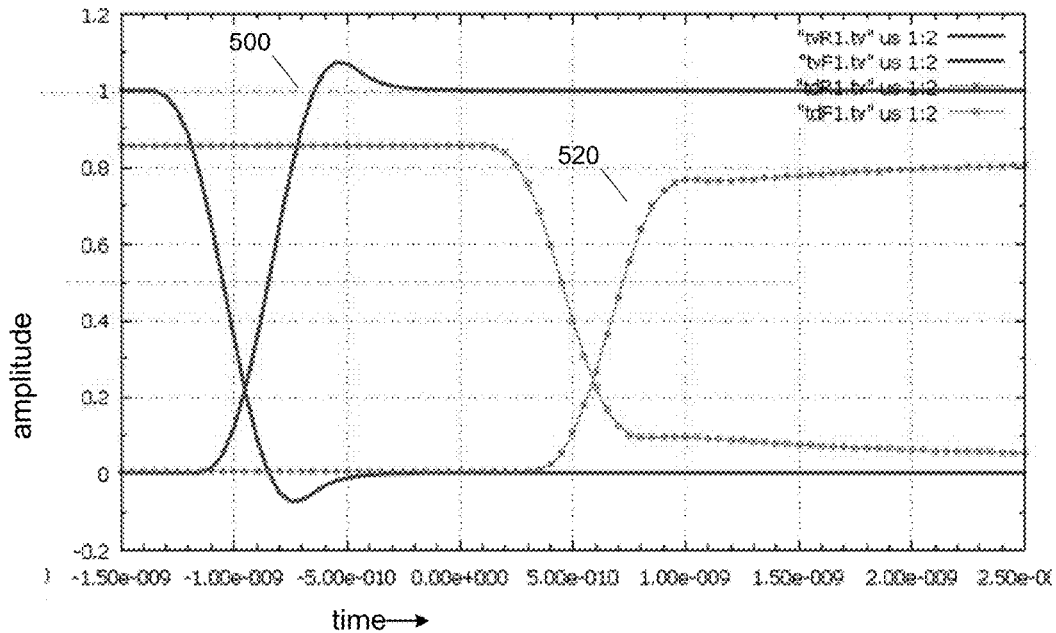
FIGS. 5A and 5B depict time-domain signals associated with use of a relay matrix assembly.
Figure 5B:
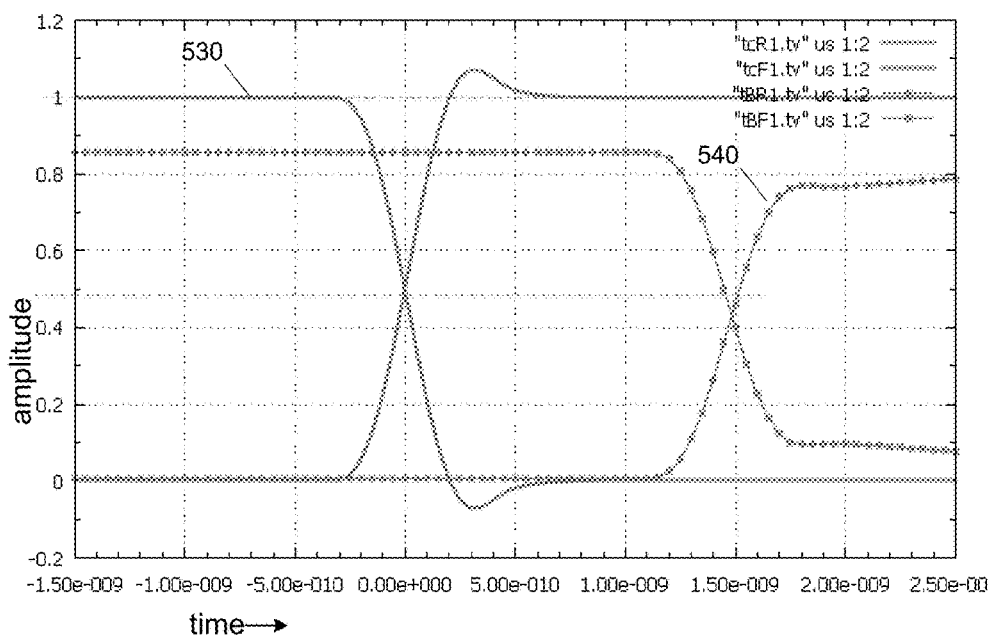

In overview and for purposes of understanding, FIGS. 5A and 5B depict just one example of how a signal may be distorted, at least in part, by transmission through a relay matrix assembly 200. In FIG. 5A, signal 500 may be an un-calibrated at-tester signal. For calibration or verification, it may be desirable to measure this signal. However, when the signal is coupled to a signal analyzer through relay matrix assembly, a distorted waveform 520 is measured at signal analyzer 420. In some implementations, the signal analyzer and associated cabling and sample heads used at the analyzer may also contribute distortion to the measured waveform.

In conducting a test, it is desired for a tester to produce waveforms that may have specific characteristics. FIG. 5B illustrates such a waveform 530. Here a waveform is shown with a cross-over at a specific time (in this case 0 ns) relative to all the other channels and at a particular amplitude. The waveform also is shown with a particular amplitude variation. It should be appreciated that waveform 530 illustrates exemplary waveform characteristics that may be specified for a tester. Different or additional characteristics may be specified in other embodiments, and different wave shapes, representative of those characteristics, may be used.

Regardless of the specific waveform characteristics, it may be desirable, as part of operation to the tester, to measure actual waveform characteristics as produced by a tester. Such measurements may be used, for example, to calibrate the test system, effectively adjusting for deviations from desired. Such measurements may alternatively or additionally be used to verify that the tester is operating within specifications. FIG. 5B illustrates a waveform 540, representing waveform 530 after it has passed through the relay matrix assembly. FIGS. 5A and 5B show that, whether calibrated or un-calibrated at the tester, the signal that can be measured after passing through the relay matrix assembly differs from the at-tester signal. Thus, in order to determine characteristics of the at-tester signal, a computation may be performed on the measured signals 520 or 540.

In a configuration as described above, the tester is connected to a signal analyzer through relay matric assembly 200. The relay matrix assembly 200 may add distortion resulting in a measured waveform 520 or 540 at the analyzer. Relay matrix assembly 200 may introduce distortion in the waveform, such as by introducing skew that changes the crossover or amplitude deviation. Thus, when waveform 520, for example, is measured for calibration or verification, distortion introduced by the relay matrix can result in inaccuracies in the calibration or verification process.

Conventional calibration techniques, for example, may measure the total deviation from ideal characteristics and provide calibration values for tester 110 that would adjust for that distortion. Computing these calibration values from signals measured after passing through relay matrix assembly 200 and then using them for testing devices under test, however, may result in inaccuracies because, in the illustrated embodiment, the relay matrix assembly is not present during testing of devices under test. Using calibration values derived when the relay matrix assembly is present may introduce errors when applied to measurements made with the relay matrix assembly not present. Specifically, performing a conventional calibration process using a measured signal 520, would not result in an at-tester signal in the form of signal 530. Accordingly, the inventor has recognized and appreciated that, in order to make MEM-based relay matrix assembly accurate, values representing distortion through each path of the MEM-based relay matrix may be determined separately. Those values may be applied to remove the effect of the relay matrix assembly when making measurements for calibration or verification of the tester. Accordingly, the derived calibration values may calibrate the tester for operation when the relay matrix assembly is removed.

In order to calibrate test channels of a tester 110, distortions of waveforms caused by paths through the relay matrix assembly, and in some embodiments cabling or other components that are removed with the relay matrix assembly, are taken into account. According to some embodiments, parameters characterizing these distortions are determined separately, so that their contribution can be removed from a measured distorted waveform leaving a residual distortion that is due to a selected test channel, for example. The resulting waveform, having the residual distortion, can then be analyzed to determine calibration parameters for the test channel.

It should be appreciated that, once determined, parameters characterizing distortion in the relay matrix assembly may be applied in any suitable way. In some embodiments, these parameters may be applied mathematically, using a computation implemented by a digital signal processor, for example, to adjust measured signals before those signals are used to compute calibration values for the tester. Alternatively, the parameters characterizing distortion in the relay matrix assembly may be used to control the operation of the tester so as to generate signals that, once distorted in the relay matrix assembly, will have the desired characteristics.

Referring again to FIG. 4 and FIG. 5, removing distortion contributions due to the relay matrix assembly 200 may yield a waveform that would be present at the tester output, without distortion by the relay matrix assembly. In some embodiments, the distortions of the relay matrix assembly may be removed via numerical computation, e.g., using a software algorithm that operates on the measured waveform 520 to remove distortion introduced by the relay matrix assembly, for example. In some embodiments, the resulting waveform after removal of the effects of relay matrix assembly 200 would be substantially equivalent to a waveform measured from the tester output contact by a conventional calibrated robotic probe, and may be used for calibrating the tester using known techniques.

The distortion introduced by the relay matrix assembly may be measured in any suitable way. It is not a requirement that the measurement be made while the relay matrix assembly is attached to a tester. To the contrary, measurements on the relay matrix assembly may be made at any suitable time and at any suitable location, and may be made with calibrated instruments.

One method that may be used to characterize waveform distortion introduced by the relay matrix assembly and associated components comprises measuring transmitted and reflected waveforms for each path in the time domain, and determining from the measured waveforms cross-coupling coefficients and scattering parameters (S-parameters) for a scattering matrix model of the paths. For example, S-parameters may be determined for the relay matrix assembly 200 from time domain measurements made for the relay matrix assembly. The scattering parameters may then be used, for example, in a numerical calculation to cancel waveform distortion introduced by the relay matrix assembly. S-parameters may be cascaded for several components, so that distortion for combined components may be cancelled. For example, S-parameters for a relay matrix assembly and cabling to a signal analyzer may be cascaded. A similar process may be used to cancel waveform distortion introduced by the interposer 136 and translator 138 if they are used.

Another method comprises using a vector network analyzer (VNA) to determine frequency domain responses of a path, and to calculate S-parameters from the frequency domain responses. In some embodiments, phase and amplitude corrections may be applied to a measured signal based upon the frequency domain response for the path.

The inventor has found that time-domain measurements (e.g., time domain reflection (TDR) waveforms and time domain through (TDT) waveforms) can provide a higher sampling rate for measured waveforms, and has used time-domain signals to compute S-parameters for various components in the system, including paths through the relay matrix assembly.

Figure 6A:
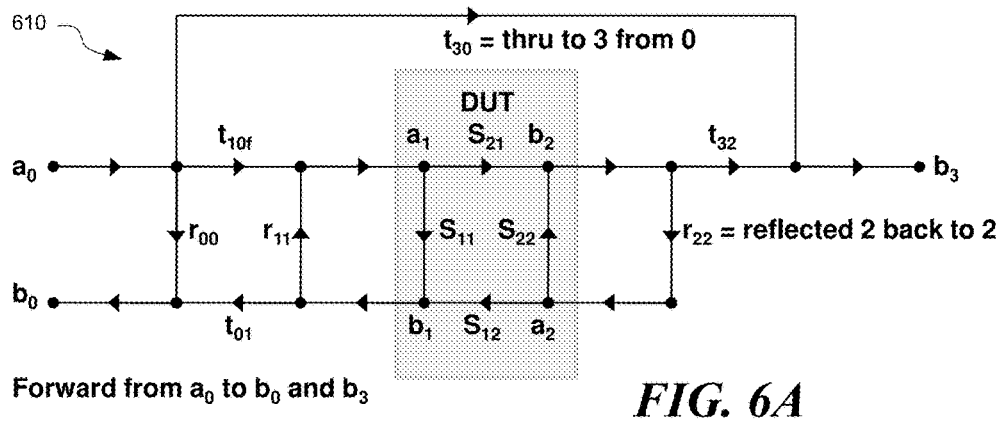
FIG. 6A represents a scattering matrix model that may be used for determining characteristic parameters in the forward direction for through-channels of a relay matrix assembly, according to some embodiments.
Figure 6B:
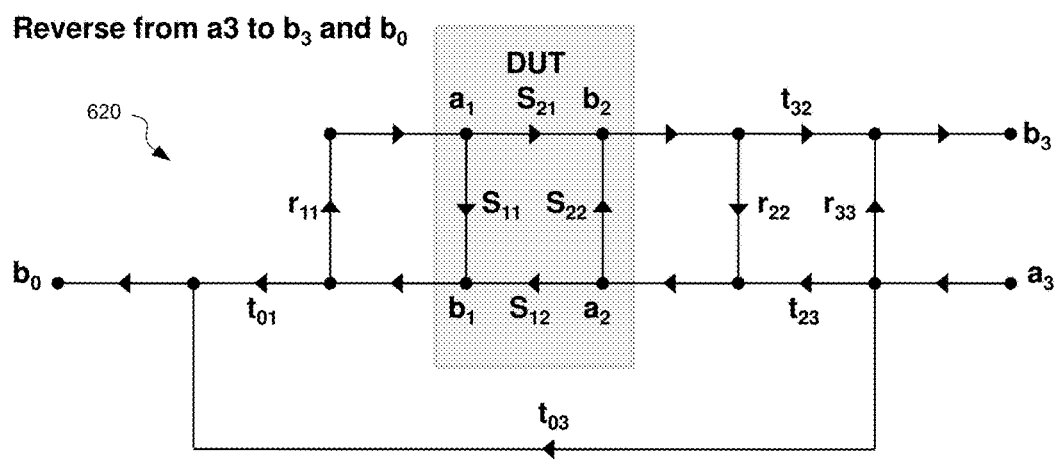
FIG. 6B represents a scattering matrix model that may be used for determining characteristic parameters in the reverse direction for through-channels of a relay matrix assembly, according to some embodiments.

FIG. 6A and FIG. 6B depict just one example of a scattering matrix model that may be used for representing, using S-parameters, the effects of one or more components in a signal path. For example, the depicted scattering matrix model may be used to represent, using S-parameters, each path through the relay matrix assembly 200. Cabling between the relay matrix assembly and signal analyzer and other components associated with the relay matrix assembly may similarly be represented by the model.

The model may comprise a forward model, depicted in FIG. 6A, and a reverse model, depicted in FIG. 6B. The scattering parameters of the component 610, which may represent a path through the relay matrix assembly and associated components that are used with the relay matrix assembly but not for testing a DUT, include a forward scattering parameter $S_{21}$, a forward reflection parameter $S_{11}$, a reverse scattering parameter $S_{12}$, and a reverse reflection parameter $S_{22}$. The model may comprise one or more coupling or cross-coupling terms that represent an amount of signal coupling between nodes of the component. Values for the S parameters of the scattering matrix model depicted in FIG. 6A and FIG. 6B may be derived from a set of measurements, sometimes referred to as a short, open, load, and through (SOLT) measurements, which may be made in the time domain. Alternatively S-parameters may be determined in the frequency domain using a VNA. However, the inventor has used TDR and TDT waveform measurements to compute S-parameters for the model for each path through the relay matrix assembly 200.

Regardless of how the parameters characterizing distortion introduced by the relay matrix assembly and associated cabling or other components are determined, those parameters may be applied in a calibration of the tester. Accordingly, a process of calibrating tester channels with a relay matrix assembly and signal analyzer can require several steps of calibration. First, the signal analyzer 420 and cabling 410 may be calibrated using calibration-grade short, open, load and through connection compatible components. This process can determine various cross-coupling terms ($c_{ij}$) in the model depicted in FIG. 6A and FIG. 6B. Calibration steps may include replacing the device under test 601 (which may be a path through the relay matrix assembly and associated components) with a short, open, or through-connection, so that cross-coupling terms can be determined for a signal analyzer. Once these cross-coupling terms are determined, the device 601 may be installed and S-parameters may be determined using the same signal analyzer. When a relay matrix assembly 200 is installed as the device, a robotic probe may be used to probe each path through the relay matrix assembly (e.g., apply a test signal to the relay matrix assembly at each input that would connect to a tester channel when calibrating the tester), according to some embodiments. However, it should be appreciated that measurements on the relay matrix assembly may occur less frequently than a tester is calibrated, and different measurement techniques, including possibly manual measurements, may be used to determine the parameters characterizing distortion in the relay matrix assembly.

Figure 7A:
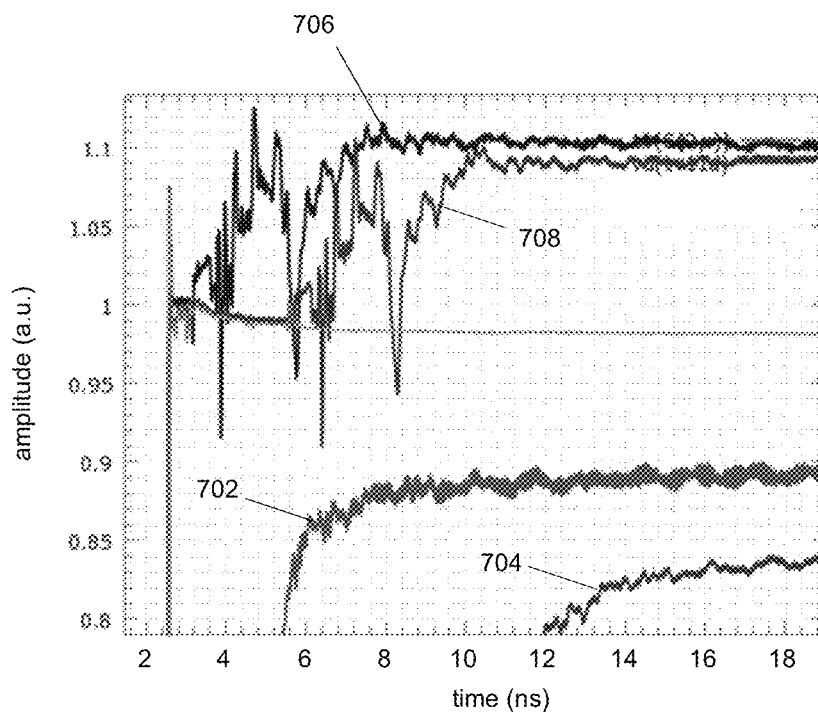
FIG. 7A depicts TDR and TDT waveforms associated with a through-channel of a relay matrix assembly, according to some embodiments.

FIG. 7A depicts an example of measured TDT and TDR waveforms 704, 708 measured at an oscilloscope for a path through a prototype relay matrix assembly, and also depicts corrected waveforms 702, 706 that have been processed to remove distortion introduced by an oscilloscope and cabling that was used to obtain the measured waveforms. The measured waveforms include a TDT waveform 704 from the selected path through the matrix assembly and a TDR waveform 708 reflected from the same path, which both include distortions due to associated interconnections to the signal analyzer. Effects of distortion introduced by the oscilloscope and interconnects to the oscilloscope may also be removed from the measured waveforms to yield the corrected waveforms 702, 706 by, for example, using previously measured s-parameters. Oscilloscope distortions can include gain and time delay, drift in the time base, and missing time steps. For missing time steps, interpolation may be used to fill in an associated missing data point.

It should be appreciated that FIG. 7A illustrates, graphically, collected data. In some embodiments, the parameters may be derived by computerized processing of the underlying data. Accordingly, once the corrected waveforms 702, 706 are obtained, they may be supplied to a processor to compute calibration values for the tester channel, by using the corrected waveforms as they could be measured. The Appendix provides example portions of MatLab code that may be executed by such a processor in some embodiments to compute coupling terms ($c_{ij}$) and S-parameters from the TDR and TDT waveforms. A resulting frequency-dependent $S_{21}$ parameter for a selected through-channel of the relay matrix assembly can then be used to determine an input waveform to the relay matrix assembly. For example, in the frequency domain an input waveform $W_i(f)$ may be determined from the expression $$W_i(f) = \frac{W_m(f)}{S_{21}}$$

where $W_m(f)$ is the measured waveform from the through-channel, corrected for any distortions introduced by the analyzer and interconnects. In the time domain, the input waveform $W_i(t)$ may also be found from a de-convolution of a time-dependent $S_{21}$ parameter for the through-channel from the measured time-domain waveform.

Figure 7B:
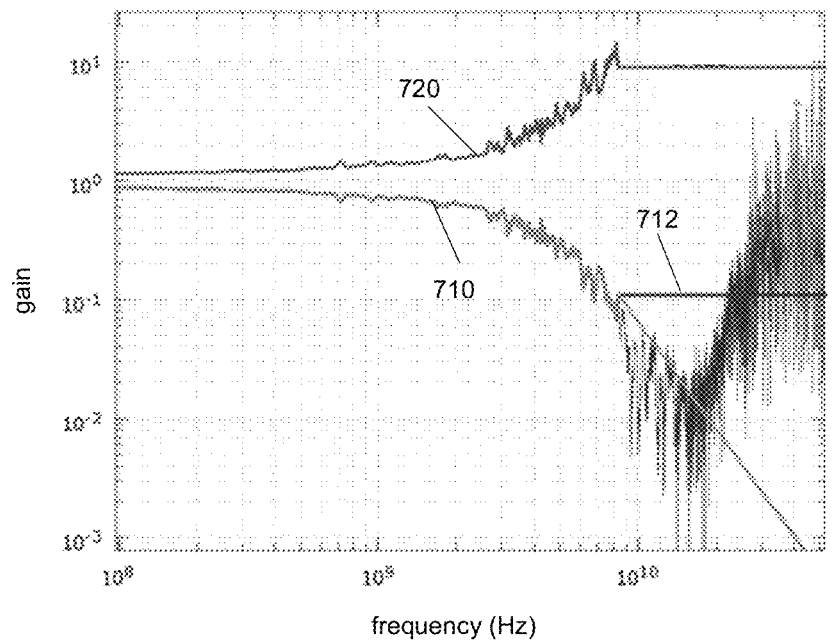
FIG. 7B represents a frequency-dependent forward-scattering parameter of a path through a relay matrix assembly, and a computed inverse, according to some embodiments.

The graph of FIG. 7B depicts a frequency-dependent $S_{21}$ parameter 710 that was computed for a selected path through a prototype relay matrix assembly 200 from TDR and TDT measurements, according to some embodiments. Also plotted on the graph is an inverse of a clipped $S_{21}$ parameter 720. The inverse $S_{21}$ parameter may be denoted $S'_{21}{}^{-1}$. This inverse parameter may be used in the equation above (instead of $1/S_{21}$) to compute $W_i(f)$.

As is known in the art, each S parameter may be a function of frequency with the value of the S parameter being different at different frequencies. The inventor has found that at high frequencies, the values of the measured S parameters are impacted more heavily by noise and other measurement artifacts than at lower frequencies. As a result, the impact of those measurement artifacts becomes proportionately greater at higher frequencies relative to the impact of the actual structure of the relay matrix assembly and associated components. Accordingly, the S parameters may be "clipped," such that the value of one or more of the S parameter at higher frequencies is derived from measurements made at lower frequencies. One such way to implement clipping is to set the value of the S parameter at all frequencies above a threshold frequency the value of the S parameter at that threshold frequency. The threshold frequency may be predetermined or dynamically determined.

In some embodiments, the frequency-dependent $S_{21}$ parameter 710 may be clipped to a flat response 712 to reduce deleterious effects of noise present in the $S_{21}$ parameter at high frequencies. The high-frequency noise can introduce spurious distortions into the compensated waveforms, and clipping the $S_{21,rma}$ parameter at high frequencies is found to not significantly affect the resulting waveforms, e.g., as compared to an idealized fall-off in amplitude. In some embodiments, the inflection point at which the $S_{21}$ parameter 720 is clipped may be at a selected attenuation value. For example, clipping may begin where the amplitude response has dropped by a factor of 10 in some embodiments, a factor of 5 in some embodiments, or a factor of 2 in some embodiments. In some implementations, clipping may begin at a selected frequency, such as approximately 3 GHz in some embodiments, or approximately 8 GHz in some embodiments. It should be appreciated that the clipped value, and frequency at which it is applied, may be based on smoothed curves rather than raw data values.

Figure 7C:
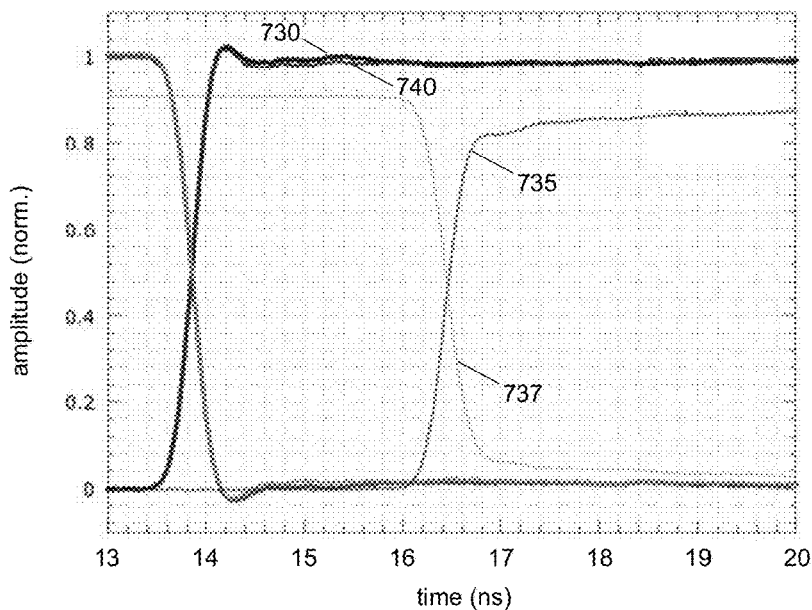
FIG. 7C represents measured and corrected signals for a test channel, according to some embodiments.

Once the parameters characterizing the relay matrix assembly, and any associated components, are determined, they may be applied in calibrating a tester using that relay matrix assembly. FIG. 7C depicts results from measurements and compensation of high-speed signals traversing a tester channel of a commercial test system and a selected path through a prototype relay matrix assembly attached to the tester. The relay matrix assembly includes a relay matrix module 210 having 15 MEMS-based 6×1 relays configured to provide 64 selectable paths through the module. Signals were measured with an oscilloscope at an output of the relay matrix assembly, and S-parameters for paths through the relay matrix assembly were calculated using a 12-term scattering matrix model, as described above.

The plot of FIG. 7C includes multiple traces and includes a measured, rising step waveform 735 that results from a rising-edge, step waveform at a tester channel of the tester 110. The plot also includes a measured, falling step waveform 737 that results from the application of a falling-edge, step waveform applied to the test channel of the tester. After applying corrections to the waveforms based upon S-parameters computed for the relay matrix assembly and associated components used only for calibration, the measured signals were adjusted to compensate for distortions introduced by the selected path through the relay matrix assembly and other calibration equipment, yielding the corrected rising-edge and falling-edge waveforms. A corrected rising-edge waveform 740 is also plotted in the graph for the test channel. This waveform is a numerically corrected waveform (derived from the measured waveform 735) that is representative of a waveform at an output contact of a tester channel at the tester interface.

The corrected rising-edge waveform 740 may be used to determine distortions introduced by the test channel and to calculate calibration parameters (e.g., S-parameters) for that channel, according to some embodiments. For example, waveform 740 may be compared to a reference waveform to determine distortion introduced by a tester channel or a desired specification for the waveform. This comparison may be used to determine calibration parameters necessary to place the waveform within instrument specifications. Alternatively or additionally, the waveform 740 may be used to qualify or verify a test channel.

FIG. 7C also includes a plot of a measured test-channel waveform 730. This waveform was measured using a conventional robotic probe technique and has been corrected for distortions introduced by the robotic probe, cabling, and signal analyzer. As can be seen, the waveform 730 obtained by conventional techniques is approximately equal to the corrected test-channel waveform 740 obtained using the relay matrix assembly, with correction for distortion caused by the relay matrix assembly. Accordingly, a relay matrix assembly may be used to accurately measure and characterize test channel signals from a tester without time-consuming, serial, robotic probing of individual test channels. Numerical corrections may be applied to waveforms measured with a relay matrix assembly to accurately reconstruct test channel waveforms from tester channel contacts.

In some embodiments, the calibration parameters reflecting the relay matrix assembly, and associated components, may be determined at a factory where the relay matrix assembly is manufactured or at some other service area before the relay matrix assembly is used. The determined parameters may be used throughout the life of the relay matrix assembly or for some period of time. However, S-parameters for a relay matrix assembly may vary or drift over time due to aging or temperature effects. In some implementations, S-parameters for the relay matrix may be re-measured periodically or re-measured prior to each use.

Figure 8:
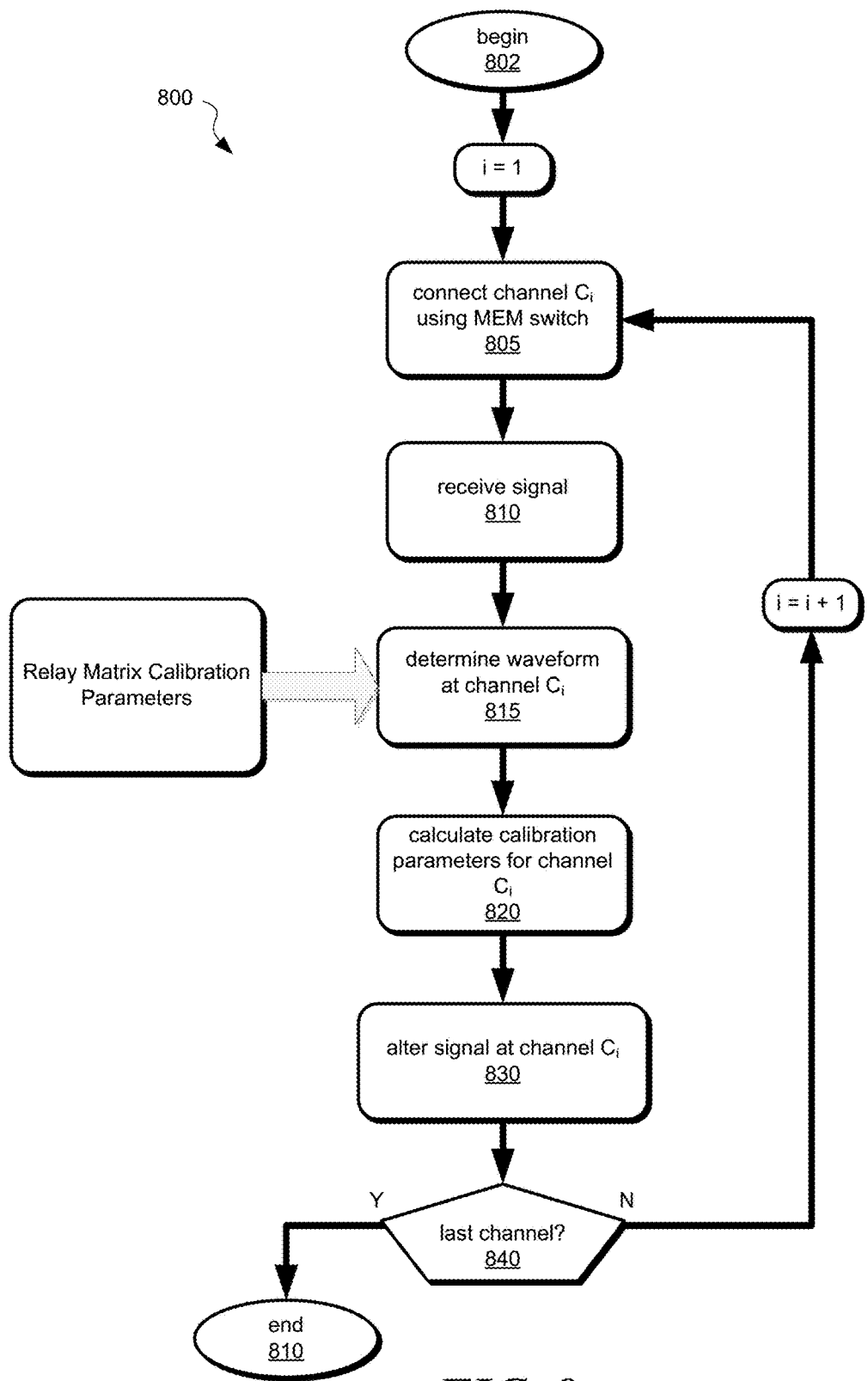
FIG. 8 depicts a method for calibrating test channels of an ATE, according to some embodiments.

FIG. 8 depicts a method 800 for calibrating test channels of an ATE that may be implemented in combination with a relay matrix assembly 200, according to some embodiments. Prior to performing the method of FIG. 8, the S parameters of the relay matrix assembly (including any associated components) may be determined and stored for use by a computing device processing signals measured during tester calibration.

Calibration may be performed for a plurality of tester channels. Accordingly, the method may begin at step 802 where a tester channel counter i for a group or plurality of test channels of an ATE is set equal to one. The method 800 may comprise connecting 805 a selected test channel $C_i$ to a signal analyzer 420 using a relay matrix assembly. The connecting 805 may comprise activating one or more MEM relays of a relay matrix module to select a particular path through the relay matrix assembly to connect the test channel $C_i$ to the signal analyzer.

The method may further comprise receiving 810 a waveform at the signal analyzer from the test channel $C_i$. The received waveform may then be processed to determine 815 an output waveform from the test channel. This step may comprise removing distortions introduced by the relay matrix assembly and any interconnects between the tester interface 131 and signal analyzer 420 that are used in calibration and are not used in measuring a DUT, for example. In some implementations, determining 815 an output waveform may comprise correcting the received waveform using S-parameter values that have been determined for the relay matrix assembly.

Any suitable technique may be used to compute a waveform representative of what is supplied by a tester channel without distortion caused by the relay matrix assembly. The S parameters, for example, may be expressed as a frequency-domain transfer function, for example, and the computation may entail applying the inverse of the transfer function to the measured signal. In other embodiments, the calculation may be performed in a time domain by expressing the distortion of the relay matrix assembly as an impulse response and de-convolving the measured signal with the impulse response of the relay matrix assembly and associated calibration components.

Regardless of the specific computation techniques used to compute the waveform at tester channel $C_i$, the computed waveform may be used to determine calibration parameters for tester channel $C_i$ using techniques as are known in the art. According to some embodiments, a method 800 may comprise calculating 820 one or more calibration parameters for the tester channel $C_i$. Alternatively or additionally, waveform fidelity attributes, such as whether the channel meets specification, may be determined.

The calibration parameters may be used during testing a device under test. In some embodiments, the calibration parameters for a tester channel may be applied as part of a computation performed on a measured waveform to derive a corrected waveform. Such a computation may be performed in any suitable way, including using techniques as described above to compute a waveform at a tester channel from a measurement made on a waveform after it had been distorted in a relay matrix.

However, in some embodiments, the tester, once calibrated will be used to test multiple DUTs as quickly as possible. Accordingly, adjusting the tester channels based on the calibration parameters may result in faster testing. It is known for testers to include circuitry that can be programmed to effect calibration, and, in some embodiments, the calibration parameters may be used to alter operation of the tester. In these embodiments, the method may include altering 830 a signal at the test channel $C_i$. In some implementations, altering a signal at the test channel may comprise adjusting a signal driver and/or signal filters for the test channel. The altering may comprise adjusting signal delay, waveform shape, and/or signal levels for the test channel.

The tester calibration illustrated in FIG. 8 may be repeated throughout the life of a tester. The calibration might be performed daily, at the start of each manufacturing shift or at some other timed interval. Alternatively, the calibration method may be performed when the tester is configured for testing a particular style of DUT or in response to some other trigger event. However, in some embodiments, the calibration parameters calculated for the test channel may be used at multiple times and may be stored for subsequent use.

The method may further include determining 840 whether a last channel of the plurality of test channels has been calibrated. If the last channel has been calibrated the calibration process may terminate 810. If the last channel has not been calibrated, the test-channel counter may be incremented, and the method 800 return to the step of connecting 805 a next test channel to the signal analyzer. The process may loop until all channels of the ATE have been calibrated.

In some embodiments, the controller 430, signal analyzer 420, and/or tester 110 may comprise at least one processor and related hardware components suitable for storing and executing machine-readable instructions that adapt the at least one processor to execute method steps and functions associated with determining calibration parameters for a relay matrix assembly (including associated components) and for calibrating test channels of an ATE as described herein. These operations may be performed at the same time or at separate times and at separate locations. It should be appreciated that these operations are described together; it is not a requirement that they be performed at the same time, at the same frequency or with the same equipment.

Figure 9:
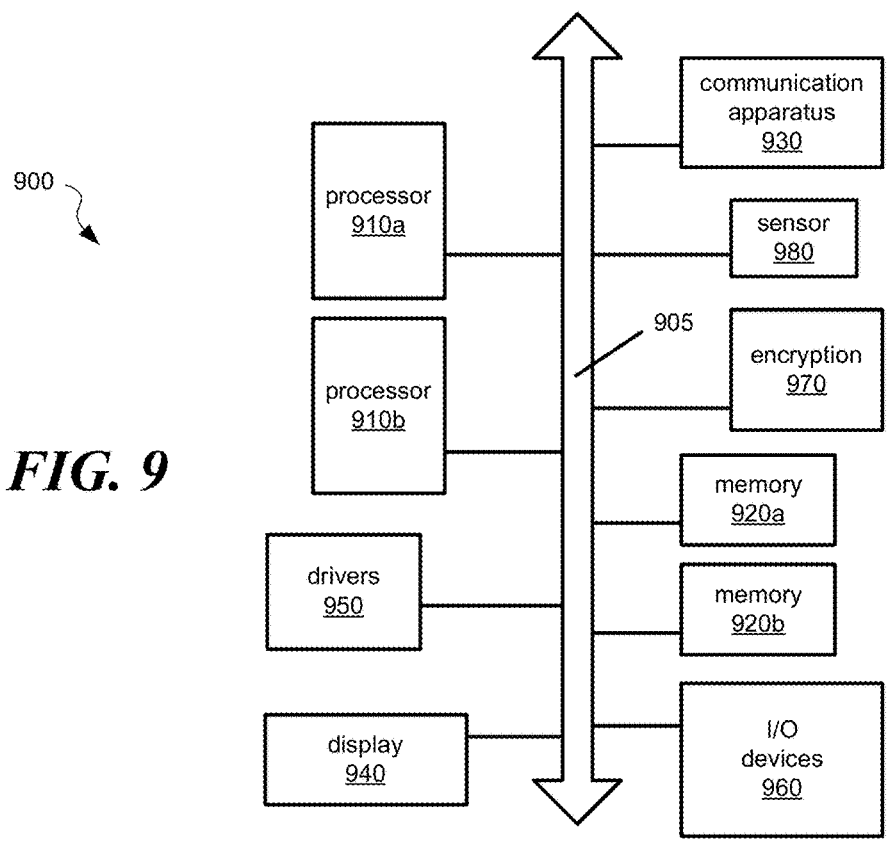
FIG. 9 depicts an example of a data processing and instrument control system, according to some implementations.

Nonetheless, similar equipment may be used to measure signals and compute and, in some embodiments, apply calibration parameters for both a relay matrix assembly and a tester channel. Accordingly, an example of a suitable processing system may serve as an example of a system used to derive calibration parameters for any components. An example of a processing system 900 is depicted in FIG. 9, according to some embodiments. According to some embodiments, a processing system may include machine-readable instructions stored in memory that are executed on at least one processor to manage operation of one or more components of the ATE and calibration system.

As an example, a processing system 900 may include at least one processor 910*a*, 910*b* and related hardware. The at least one processor may be configured to control and provide user interaction for operating the device. The at least one processor may be used in combination with memory devices 920*a*, 920*b*. The memory may include any type and form of RAM-type memory device and ROM-type memory device. A memory device may store machine-readable instructions that can be loaded onto and executed by the at least one processor to specially adapt the at least one processor to perform functionality defined by the machine-readable instructions. When in operation, an operating system may execute on at least one processor and provide for user interaction and operation of an instrument, which may include running multiple software applications and/or programs on the processing system.

According to some embodiments, a processor 910*a*, 910*b* may comprise any type and form of data processing device, e.g., any one or combination of a microprocessor, microcontroller, a digital signal processor, an application specific integrated circuit (ASIC), and at least one field-programmable gate array (FPGA). There may be more than one processor in the system in some embodiments, e.g., dual core or multi-core processors, or plural processors communicating with at least one controlling processor. In some implementations, there may be a single processor in the processing system.

An instrument that includes the processing system 900 may further include a display 940 (e.g., comprising any one or combination of a video monitor, an LCD display, a plasma display, an alpha-numeric display, LED indicators, etc.). The instrument may further include one or more input/output devices 960 in some embodiments (e.g., keyboard, touchpad, buttons, switches, touch screen, microphone, speaker, printer), and communication apparatus 930 (e.g., networking software, networking cards or boards, wireless transceivers, and/or physical sockets). The instrument may include device drivers, e.g., software modules specifically designed to execute on the one or more processor(s) and adapt the processor(s) to communicate with and control system components. In some embodiments, the processing system may include encryption/decryption hardware and/or software 970 that may be used to encrypt selected outgoing data transmissions and decrypt incoming encrypted data transmissions. Components of an instrument in which the processing system is located may communicate over a bus 905 that carries data and control signals between the components. The bus may provide for expansion of the system to include other components not shown in FIG. 9.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

The embodiments have been described mainly in terms of action of a single relay matrix module 210. It will be appreciated that two or more relay matrix modules may be operated in parallel in some implementations. For example, signals from multiple test channels may be received from a tester and processed simultaneously, so that two or more channels may be calibrated at a time. In some implementations, a signal analyzer may be configured to receive two or more signals at a time, or multiple signal analyzers may be used.

The terms "approximately" or "about" may be used herein to refer to a value that is within ±5% of a target value in some embodiments, within ±10% of a target value in some embodiments, within ±20% of a target value in some embodiments, and yet within ±30% of a target value in some embodiments. When large ranges spanning at least three orders of magnitude are involved, these terms may be used to mean within a factor of two, or within an order of magnitude.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

APPENDIX

This section includes excerpts from computer code, written using MatLab, that may be used for calculating S-parameters for a component of test system, such as a path through a relay matrix assembly. These calculations are based on a 12-term, scattering matrix model. Other calculations for other scattering matrix models may be used in some implementations.

TABLE 1

Sample Computer Code

```
% generate forward and reverse error vectors nTsoltTv2.m lines 88-94 abridged)
[r00f, r11f, t01t10f]   = sol (vShort_1, vOpen_1, vLoad_1);
[r33r, r22r, t23t32r]   = sol (vShort_2 , vOpen_2 , vLoad_2);
[r30f, r22f, t10t32f]   = solt(vTdr_3, vTdt_3, r00f, r11f, r22r, t01t10f);
```

TABLE 1-continued

Sample Computer Code

```
[t03r, r11r, t23t01r]  = solt(vTdr_4, vTdt_4, r33r, r22r, r11f, t23t32r);
[S]                    = soltDut(vT11, vT21, vT12, vT22, ...
                            r00f,r11f,r22f,t01t10f,t10t32f,t30f, ...
                            r33r,r11r,r22r,t23t32r,t23t01r,t03r);
...
% convert time/ voltage waveforms to frequency domain and return e00, e11, e01e10 (sol.m lines 13-45 abridged)
%
===============================================================================
% use short, open and load to determine:
% r00     the reflection before the calibration plane
% r11     the source mis-match
% t01t10  the round-trip frequency response
function [r00, r11, t01t10] = sol(tvShort, tvOpen, tvLoad)
    % These 3 vectors have errors to be corrected:
    %   5mm calibration plane shift, stray capacitance on the open and inductance in the short [i][ii][iii]
    % Correction of these standardized calibration errors is not shown
    Gshrt  = fft(tvShort);   % Note: the incoming waveforms are Gans windowed [iv] and
    Gopn   = fft(tvOpen);    % to avoid even harmonics = 0 [v] offset the fold duty-cycle by 1 time-step
    Gld    = fft(tvLoad);
    r00    = Gld;
    in     = 2 .*    (Gld–Gshrt)    ./ (Gopn–Gshrt);
    r11    = 1                      – in;
    t01t10
    ...
% return t30, r22, t10t32 (solt.m lines 13-32 abridged)
%
===============================================================================
% use short, open and load calibration terms from sol( ) to determine:
% t30     the coupling between TDR channels 1 to 2 when they are separately terminated and not connected,
% r22     the through channel mis-match
% t10t32  the one-way frequency response
function [t30, r22, t10t32] = solt(tvTdr,tvTdt,r00,r11,r22,t01t10,tvTdto)
    N       = length(tvTdr);
    if length(tvTdto) < N,   t30 = [zeros(1, N)]; % if data is missing return 0 coupling, 10-term
    else                     t30 = fft(tvTdto);
    end
    s11m    = fft(tvTdr);
    s21m    = fft(tvTdt);
    r22     = (s11m – r00) ./ (s11m .* r11 – (r00 .* r11 – t01t10));
    t10t32  = (s21m – t30) .* (1 – r11 .* r22);
    ...
% return S-parameters of the DUT only (soltDut.m ln 13-32 abridged)
%
===============================================================================
% use short, open, load and thru calibration terms from sol( ) and solt to
determine:
% S = [s11m; s21m; s12m; s22m] of the DUT
function [S] = soltDut(tv11m, tv21m, tv12m, tv22m, ...
                         r00f, r11f, r22f, t01t10f, t10t32f, t30f, ...
                         r33r, r11r, r22r, t23t32r, t23t01r, t03r)
    s11m = fft(tv11m);
    s21m = fft(tv21m);
    s12m = fft(tv12m);
    s22m = fft(tv22m);
    D   = (1+((s11m–r00f)./t01t10f).*r11f).*(1+((s22m–r33r)./t23t32r).*r22r)–
          ((s21m–t30f)./t10t32f).*((s12m–t03r)./t23t01r).*r22f.*r11r;
    s11 = ( ((s11m–r00f)./t01t10f)           .*(1+((s22m–r33r)./t23t32r).*r22r)–r22f.*((s21m–t30f)./t10t32f).*
                                               ((s12m–t03r)./t23t01r))  ./ D;
    s22 = ( ((s22m–r33r)./t23t32r)           .*(1+((s11m–r00f)./t01t10f).*r11f)–r11r.*((s21m–t30f)./t10t32f).*
                                               ((s12m–t03r)./t23t01r))  ./ D;
    s21 = (((s21m – t30f) ./ t10t32f) .* (1 + ((s22m – r33r) ./ t23t32r) .* (r22r – r22f))) ./ D;
    s12 = (((s12m – t03r) ./ t23t01r) .* (1 + ((s11m – r00f) ./ t01t10f) .* (r11f – r11r))) ./ D;
    S       = [s11; s21; s12; s22].';
    ...
```

[i] See, "3.3 Calibration Standards", Rohde & Schwartz, July 2007.
[ii] See, Agilent Electronic vs. Mechanical Calibration Kits: Calibration Methods and Accuracy", 5988-9477EN June 2003.
[iii] See, Agilent Specifying Calibration Standards for the Agilent 8510 Network Analyzer", Application Note 8510-5B July 2006.
[iv] See, W. L. Gans & N. S. Nahman, "Continuous and discrete Fourier transform of step-like waveforms", IEEE Trans. Inst. & Meas., vol. IM-31, pp. 97-101, June 1982.
[v] See, Shaarawi A, Riad S, "Spectrum Amplitude of Step-like Waveforms Using the Complete-FFT Technique", IEEE Inst. & Meas. Technology Conf. March 1985, pgs. 120-124.

The following notations relate to the 12-term scattering matrix model used for the above calculations, and described in connection with FIG. 6A and FIG. 6B.

TABLE 2

Notation for Scattering Matrix Model

| forward | reverse | |
|---|---|---|
| $r_{00f}$ | $r_{33r} =$ | $G_{m\_load}$ reflection before calibration plane |
| $r_{11f}$ | $r_{22r} =$ | $1 - 2\,\dfrac{(G_{m\_load} - G_{m\_short})}{(G_{m\_open} - G_{m\_short})}$ <br> Port mismatch, |
| $t_{01}t_{10f}$ | $t_{23}t_{32r} =$ | $2\,(G_{m\_open} - G_{m\_load})\,\dfrac{(G_{m\_load} - G_{m\_short})}{(G_{m\_open} - G_{m\_short})}$ <br> To load and back transfer function |
| $r_{22f}$ | $r_{11r} =$ | $\dfrac{(S_{11m} - r_{00})}{(S_{11m}r_{11} - r_{00}r_{11} - t_{10}t_{01})}$ <br> Port-2 match after calibration plane |
| $t_{10}t_{32f}$ | $t_{23}t_{01r} =$ | $\dfrac{(S_{11m} - r_{00})}{(S_{11m}r_{11} - r_{00}r_{11} - t_{10}t_{01})}$ <br> Port-2 match after calibration plane |
| $t_{30f}$ | $t_{03r} =$ | $(S_{21m} - t_{30f})\,(1 - r_{11}r_{22})$ <br> Through transfer function |

What is claimed is:

1. A method for calibrating a plurality of tester channels of an automated test equipment, the method comprising:
   connecting inputs of a relay matrix assembly to a plurality of tester channel contacts of the plurality of tester channels, wherein the relay matrix assembly comprises a plurality of microelectromechanical (MEM) relays configured to form a plurality of paths between the inputs of the relay matrix assembly and an output of the relay matrix assembly; and
   successively actuating portions of the MEM relays of the plurality of MEM relays to successively connect tester channels of the plurality of tester channels to a calibration instrument coupled to the output of the relay matrix assembly,
   measuring with the calibration instrument, a first waveform at the output connector, the waveform passing from a first tester channel through a first path of the plurality of paths; and
   adjusting the first waveform, based on measured parameters of the first path, and
   computing calibration parameters for the first channel based on the adjusted waveform.

2. The method of claim 1, wherein adjusting the first waveform, based on measured parameters of the first path, comprises accessing over a network a computing device storing previously derived calibration parameters for the relay matrix assembly to obtain calibration parameters based on measured parameters of the first path.

3. The method of claim 1, wherein actuating the MEM relay to connect the first tester channel is done in less than approximately 0.1 ms.

4. The method of claim 1, wherein the connecting the relay matrix assembly to the plurality of tester channel contacts comprises physically contacting at least a first plurality of the tester channel contacts to a second plurality of input contacts of the relay matrix assembly.

5. The method of claim 4, wherein connecting to the plurality of tester channel contacts are disposed in at least one region having a contact density greater than 32 contacts per square inch.

6. A method for calibrating a plurality of tester channels of an automated test equipment with a relay matrix assembly comprising a plurality of microelectromechanical (MEM) relays configured to form a plurality of paths between the inputs of the relay matrix assembly and an output of the relay matrix assembly, the method comprising:
   measuring signal distortion in the plurality of paths, wherein measuring signal distortion comprises measuring S parameters of the plurality of paths;
   computing calibration parameters for each of the plurality of paths based on the measured signal distortion, wherein computing calibration parameters comprises computing calibration parameters based on at least one clipped S parameter, and wherein the at least one clipped S parameter comprises an $S_{21}$ parameter assigned a constant value above a threshold frequency; and
   storing, in computer readable media, the computed calibration parameters.

7. The method of claim 6, wherein the computing the calibration parameters comprises determining a transfer function for each of the plurality of paths.

8. The method of claim 6, wherein computing calibration parameters comprises computing an inverse transfer function from the at least one clipped S parameter.

9. The method of claim 6, wherein the relay matrix assembly comprises an M×N MEM switch, where M is an integer greater than 1 and N is an integer equal to or greater than 1.

10. A relay matrix assembly for calibrating a plurality of tester channels of an automated test system, the relay matrix assembly comprising:
   a printed circuit board; and
   a plurality of relay matrix modules having a plurality of microelectromechanical (MEM) relays, the plurality of relay matrix modules being arranged on the printed circuit board and configured to enable connection of any one of M input contacts of the relay matrix assembly with any one of N output contacts of the relay matrix assembly,
   wherein:
   the relay matrix modules have inputs connected to contacts on the printed circuit board;
   the contacts on the printed circuit board are arranged in a plurality of localized regions having a contact density of greater than 64 contacts per square inch, and the relay matrix modules are mounted to the printed circuit board such that inputs of at least two of the relay matrix modules are connected to contacts on the printed circuit board in a localized region of the localized regions.

11. The relay matrix assembly of claim 10, wherein a portion of the at least two of the relay matrix modules connected to contacts on the printed circuit board overlays the localized region.

12. The relay matrix assembly of claim 10, wherein the density of the M input contacts is greater than 32 per square inch in a plurality of localized regions.

13. The relay matrix assembly of claim 10, wherein each of the MEM relays has a switching time of less than 0.1 ms.

14. The relay matrix assembly of claim 10, further comprising computer readable medium storing numerical calibration parameters for a plurality of paths through the relay matrix assembly formed by selective activation of MEM relays, wherein the calibration parameters, when applied to a waveform transmitted through a path of the plurality of paths, compensates for waveform distortion introduced by the path.

15. The relay matrix assembly of claim 10, wherein the printed circuit board comprises a high-speed printed circuit board configured to transmit digital signals at data rates greater than 10 Gb/s.

* * * * *